(12) United States Patent
Vilangudipitchai et al.

(10) Patent No.: US 9,178,496 B2
(45) Date of Patent: Nov. 3, 2015

(54) LOW LEAKAGE RETENTION REGISTER TRAY

(71) Applicant: QUALCOMM, Incorporated, San Diego, CA (US)

(72) Inventors: Ramaprasath Vilangudipitchai, San Diego, CA (US); Prayag Bhanubhai Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/605,805

(22) Filed: Jan. 26, 2015

(65) Prior Publication Data

US 2015/0130524 A1 May 14, 2015

Related U.S. Application Data

(62) Division of application No. 13/787,666, filed on Mar. 6, 2013, now Pat. No. 8,975,934.

(51) Int. Cl.
*H03K 3/356* (2006.01)
*H03K 3/012* (2006.01)
*H03K 3/57* (2006.01)
*H03K 19/00* (2006.01)
*G06F 1/32* (2006.01)

(52) U.S. Cl.
CPC ........ *H03K 3/012* (2013.01); *G06F 1/32* (2013.01); *H03K 3/57* (2013.01); *H03K 19/0016* (2013.01)

(58) Field of Classification Search
None
See application file for complete search history.

(56) References Cited

U.S. PATENT DOCUMENTS

| 7,577,858 | B2 | 8/2009 | Garg et al. |
| 7,652,513 | B2 | 1/2010 | Rao et al. |
| 7,772,916 | B2 | 8/2010 | Im |
| 7,948,263 | B2 | 5/2011 | Kim et al. |
| 8,218,375 | B2 | 7/2012 | Joo et al. |
| 8,253,438 | B2 | 8/2012 | Hoberman et al. |
| 2004/0266092 | A1 | 12/2004 | Aksamit |
| 2006/0255849 | A1 | 11/2006 | Chun |
| 2006/0267654 | A1* | 11/2006 | Gururajarao et al. ......... 327/208 |
| 2009/0058484 | A1 | 3/2009 | Rao et al. |
| 2009/0066386 | A1 | 3/2009 | Lee |
| 2010/0073042 | A1 | 3/2010 | Choi |
| 2011/0176653 | A1 | 7/2011 | Veggetti et al. |
| 2012/0131526 | A1 | 5/2012 | Schreiber et al. |
| 2012/0182792 | A1 | 7/2012 | Cheng et al. |
| 2014/0253197 | A1 | 9/2014 | Vilangudipitchai et al. |

FOREIGN PATENT DOCUMENTS

| WO | 0067380 A1 | 11/2000 |
| WO | 2006127888 A2 | 11/2006 |

OTHER PUBLICATIONS

International Search Report and Written Opinion—PCT/US2014/018811—ISA/EPO—Aug. 11, 2014.
Mahmoodi-Meimand H., et al., "Data-Retention Flip-Flops for Power-Down Applications," Proceedings of the 2004 International Symposium on Circuits and Systems, 2004, vol. 2, pp. II-677-II-680.
Partial International Search Report—PCT/US2014/018811—ISA/EPO—Jun. 3, 2014.

* cited by examiner

*Primary Examiner* — Cassandra Cox
(74) *Attorney, Agent, or Firm* — Novak Druce Connolly Bove + Quigg LLP

(57) ABSTRACT

A particular method includes receiving a retention signal. In response to receiving the retention signal, the method includes retaining state information in a non-volatile stage of a retention register and reducing power to a volatile stage of the retention register. The non-volatile stage may be powered by an external voltage source. The volatile stage may be powered by an internal voltage source.

9 Claims, 9 Drawing Sheets

LOW LEAKAGE RETENTION REGISTER TRAY

I. RELATED APPLICATION

The present application is a divisional of U.S. application Ser. No. 13/787,666, filed on Mar. 6, 2013, the entire specification of which is incorporated herein by reference.

II. FIELD

The present disclosure is generally related to leakage current reduction.

III. DESCRIPTION OF RELATED ART

Electronic devices (e.g., mobile phones) that are powered by a stored power source (e.g., batteries) may be placed in a standby mode to conserve power consumption during periods of inactivity. In the standby mode, circuits of the electronic device may be turned off and logic states associated with the circuits may be lost. However, some logic states (e.g., control information) should be retained during the standby mode for the electronic device to function properly after the electronic device exits the standby mode. Such logic states may be stored in retention registers. Multiple retention registers may be coupled together to form a retention register tray. Certain circuits that drive the retention register tray may consume power in the standby mode due to leakage current associated with transistors of such circuits. The leakage current contributes to overall power consumption of the electronic device, reducing available operation time of the electronic device.

IV. SUMMARY

In a particular embodiment, a circuit includes a clock gating circuit and a retention register tray that preserves state information in a standby mode (e.g., a mode in which an internal power source is powered down). A portion of each of the clock gating circuit and the retention register tray is powered by an internal power source and a portion of each of the clock gating circuit and the retention register tray is powered by an external power source. The internal power source may be internal to a region of a device that contains the retention register tray, and the external power source may be external to the region of the device that contains the retention register tray. The clock gating circuit and the retention register tray may be configured to reduce a leakage current when the clock gating circuit and the retention register tray enter the standby mode. Thus, an available operation time of an electronic device that includes the clock gating circuit, the retention register tray, or both, may be increased when the electronic device runs on stored power.

In a particular embodiment, a circuit includes a retention stage including a transistor having a first clock input. The retention stage may be powered by an external voltage source. The circuit further includes an inverter that is responsive to an output of the retention stage. The inverter may be powered by an internal voltage source.

In another particular embodiment, an apparatus includes a means for switching data. The means for switching data may include a gate having a clock input. The means for switching data may be powered by an external voltage source. The apparatus further includes a means for inverting an output of the means for switching data. The means for inverting may be powered by an internal voltage source.

In another particular embodiment, a method includes receiving a clock signal at a retention stage. The retention stage may include a transistor having a clock input. The retention stage may be powered by an external voltage source. The method further includes providing an output from the retention stage to an inverter. The inverter may be powered by an internal voltage source.

In another particular embodiment, a computer-readable storage device includes instructions that, when executed by a processor, cause the processor to initiate providing a retention signal to a retention stage. The retention stage may be powered by an external voltage source, and the retention stage may be configured to receive a clock signal. The retention stage may be configured to provide an output to an inverter. The inverter may be powered by an internal voltage source.

In another particular embodiment, a circuit includes a first retention register that includes a first non-volatile region and a first volatile region. The circuit further includes a second retention register that includes a second non-volatile region and a second volatile region. The first retention register may be coupled to the second retention register. The first non-volatile region and the second non-volatile region may be located in a first n-type well (n-well). The first n-well may be connected to an external voltage source. The first volatile region and the second volatile region may be located in a second n-well. The second n-well may be connected to an internal voltage source.

In another particular embodiment, a method includes receiving a retention signal. In response to the retention signal, the method includes retaining state information in a non-volatile stage of a retention register and reducing power to a volatile stage of the retention register. The non-volatile stage may be powered by an external voltage source. The volatile stage may be powered by an internal voltage source.

One particular advantage provided by at least one of the disclosed embodiments is that leakage current associated with a clock gating circuit may be reduced when the clock gating circuit is in a standby mode as compared to circuits that do not have a portion of a clock gating circuit that is powered by an internal power source and a portion of a clock gating circuit that is powered by an external power source. Thus, an available operation time of an electronic device that incorporates the clock gating circuit may be increased.

Another particular advantage provided by at least one of the disclosed embodiments is that leakage current associated with a retention register tray may be reduced when the retention register tray is in a standby mode as compared to circuits that do not have a portion of a retention register tray that is powered by an internal power source and a portion of a retention register tray that is powered by an external power source. Thus, an available operation time of an electronic device that incorporates the retention register tray may be increased.

Another particular advantage provided by at least one of the disclosed embodiments is that the retention register tray may reduce manufacturing complexity of an electronic device by merging a non-volatile region of at least two retention registers together during fabrication.

Another particular advantage provided by at least one of the disclosed embodiments is that the retention register tray may reduce manufacturing complexity of an electronic device by merging a volatile region of at least two retention registers together during fabrication.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
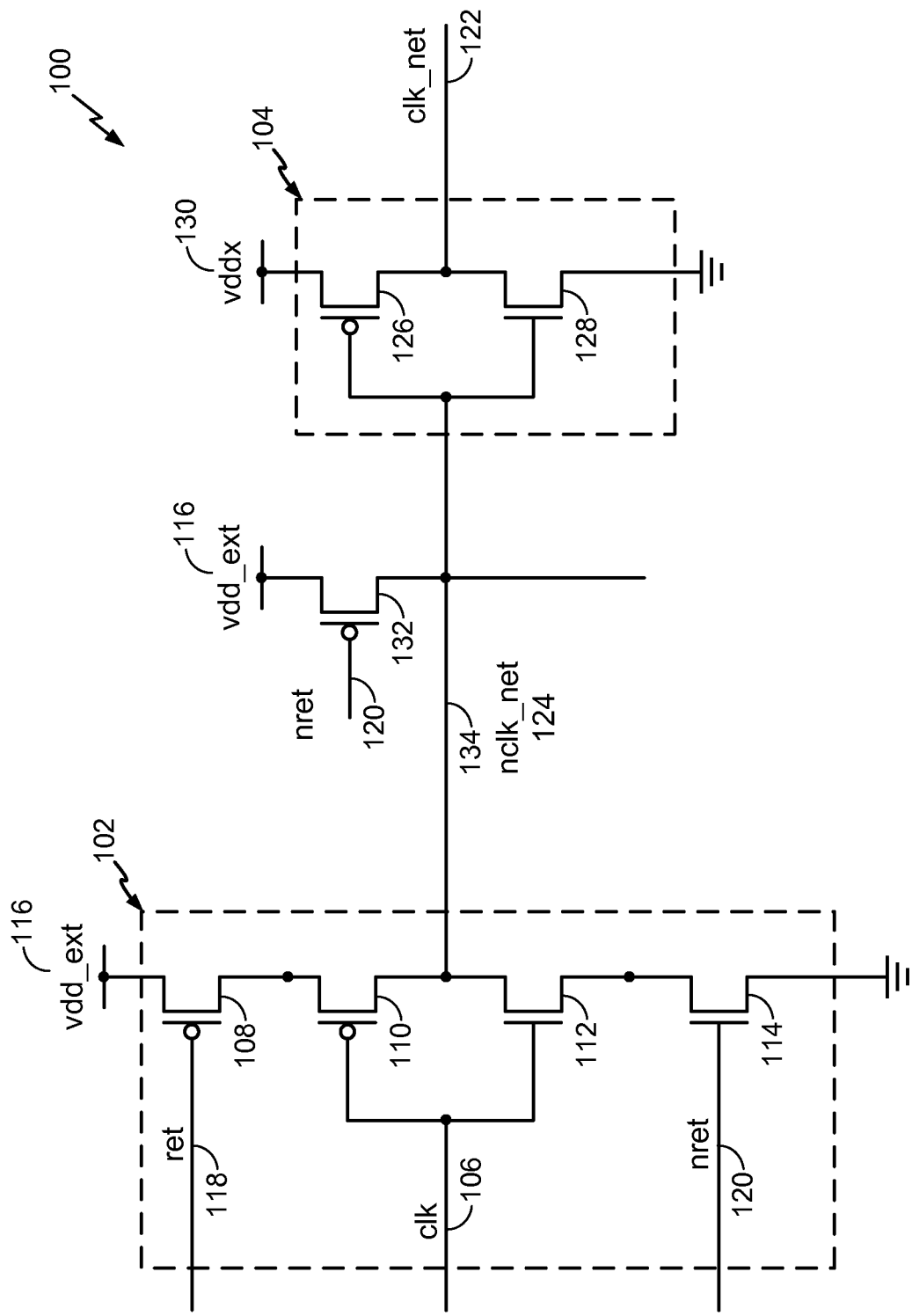
FIG. 1 is a diagram of a particular embodiment of a clock gating circuit.

Referring to FIG. 1, a particular illustrative embodiment of a clock gating circuit 100 is shown. The clock gating circuit 100 includes a first stage and a second stage. The first stage may include a retention stage 102. The first stage may be powered by an external voltage source (vdd_ext) 116 that has a higher voltage than an internal voltage source (vddx) 130. The external voltage source 116 may remain on during a standby mode. The second stage may include an inverter 104. The second stage may be powered by the internal voltage source 130. The use of the external voltage source 116 at the retention stage 102 may reduce a bulk leakage current associated with the retention stage 102 as compared to powering the retention stage 102 using the internal voltage source 130.

The retention stage 102 may receive a retention signal (ret) 118, an inverted retention signal (nret) 120, and an external clock signal (clk) 106 as inputs. The retention signal 118 and the inverted retention signal 120 may be provided by one or more circuits external to the clock gating circuit 100 and external to the retention register tray 200 described with reference to FIG. 2. For example, the retention signal 118 and the inverted retention signal 120 may be received from a processor based on a determination by the processor to enter a standby mode. The external clock signal 106 may be provided by one or more circuits (e.g., from a crystal oscillator) external to the clock gating circuit 100 and external to the retention register tray 200. The retention stage 102 may output an inverted internal clock signal (nclk_net) 124 to the inverter 104 via a data line 134. The retention stage 102 may include a p-channel metal-oxide-semiconductor (PMOS) transistor stack coupled to a n-channel metal-oxide-semiconductor (NMOS) transistor stack. The PMOS transistor stack may include a first PMOS transistor 108 and a second PMOS transistor 110 coupled in series. The NMOS transistor stack may include a first NMOS transistor 112 coupled in series with the second PMOS transistor 110 and a second NMOS transistor 114 coupled in series with the first NMOS transistor 112. When the retention signal 118 is high (i.e., in a state associated with a logical high value) and the inverted retention signal 120 is low (i.e., in a state associated with a logical low value), the retention stage 102 may be configured to enter a standby mode where the data line 134 is electrically isolated from the external voltage source 116 and from ground by the retention stage 102. When the retention signal 118 is low and the inverted retention signal 120 is high, the retention stage 102 may output the inverse of the external clock signal 106 as the inverted internal clock signal 124. The PMOS stack and the NMOS stack may reduce leakage current associated with the retention stage 102 due to self-reverse biasing effects.

The external voltage source 116 may be a voltage source that is external to a region containing a retention register tray 200, as further described with reference to FIG. 2. The external voltage source 116 may remain on during a standby mode that is enabled via the retention signal 118. A bulk connection for the first PMOS transistor 108 and a bulk connection for the second PMOS transistor 110 may be connected to the external voltage source 116. The use of the external voltage source 116 at the retention stage 102 may reduce a bulk leakage current (e.g., a gate to bulk leakage current) associated with the first PMOS transistor 108 as compared to powering the retention stage 102 using the internal voltage source 130 because the external voltage source 116 has a higher voltage than the internal voltage source 130, and because the retention signal 118 is powered by the external voltage source 116. The external voltage source 116 may cause a reduced difference in potential between a gate terminal and a body terminal of the first PMOS transistor 108, resulting in reduced bulk leakage current. The use of the external voltage source 116 at the retention stage 102 may reduce a bulk leakage current associated with the second PMOS transistor 110 for similar reasons.

The inverter 104 may include a third PMOS transistor 126 coupled in series with a third NMOS transistor 128. The inverter 104 may be configured to invert the inverted internal clock signal 124 and to output an internal clock signal (clk_net) 122.

The inverter 104 may be powered by the internal voltage source 130. The internal voltage source 130 may be derived from the external voltage source 116 and may have a smaller voltage value than the external voltage source 116. The internal voltage source 130 may be internal to a region of a device that contains the retention register tray 200, as further described with reference to FIG. 2. The internal voltage source 130 may be disabled during the standby mode when the retention signal 118 is enabled. For example, during the standby mode, the internal voltage source 130 may be turned off by disconnecting the internal voltage source 130 from the external voltage source 116. Use of the internal voltage source 130 at the inverter 104 may reduce a leakage current associated with the inverter 104 by reducing a sub-threshold leakage current associated with the third PMOS transistor 126.

A fourth PMOS transistor 132 may be connected to the external voltage source 116. The fourth PMOS transistor 132 may also be connected to the data line 134. The fourth PMOS transistor 132 may be a pull-up device that is configured to set the inverted internal clock signal 124 high (i.e., to a state associated with a logical high value) by coupling the data line 134 to the external voltage source 116 during the standby mode. As a result, the internal clock signal 122 is set to low during the standby mode.

Accordingly, a leakage current associated with the clock gating circuit 100 when the clock gating circuit 100 is in a standby mode may be reduced. Thus, an available operation time of an electronic device that incorporates the clock gating circuit 100 may be increased.

Figure 2:
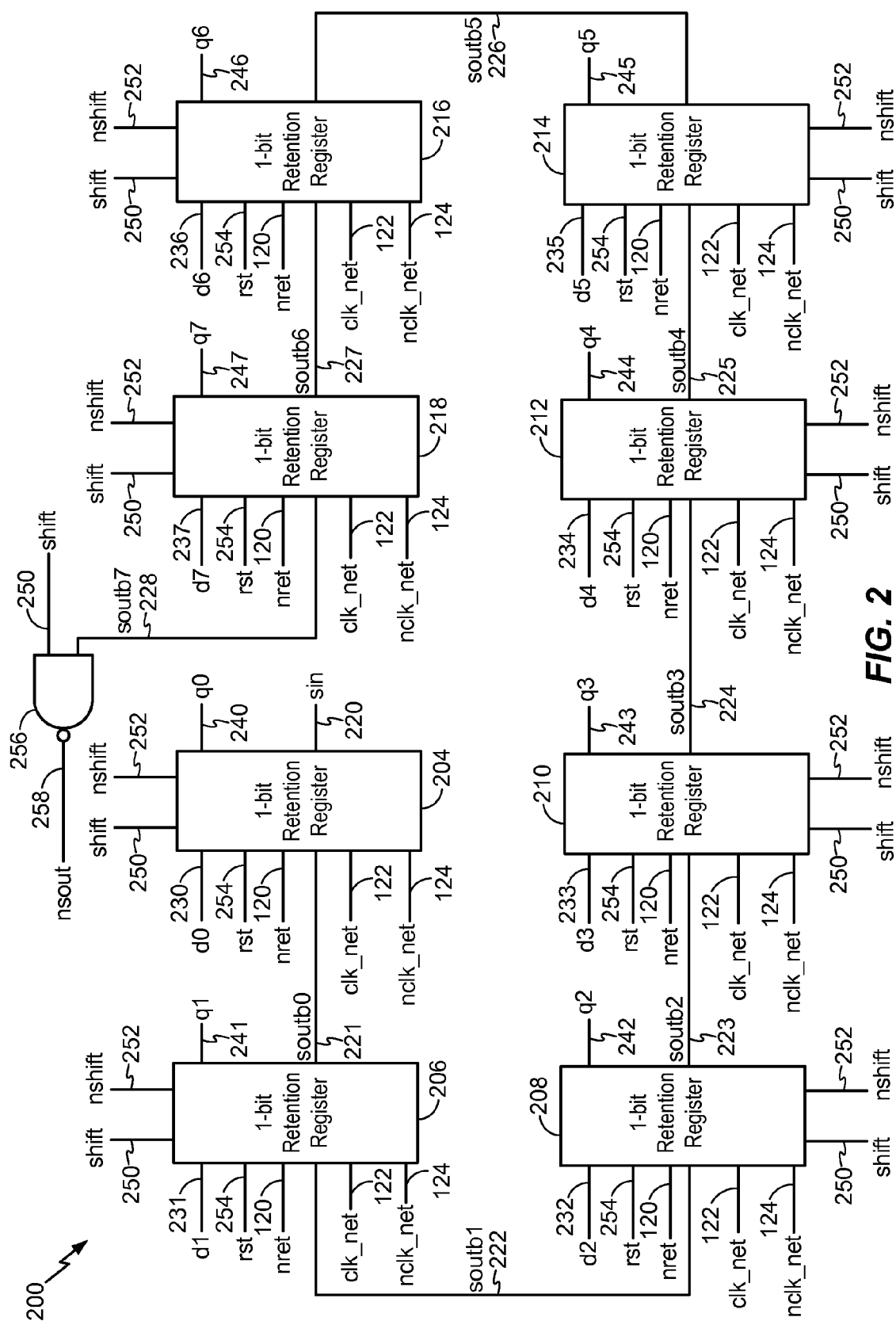
FIG. 2 is a diagram of a particular embodiment of a retention register tray.

Referring to FIG. 2, a particular embodiment of a retention register tray 200 is shown. The retention register tray 200 may include one or more one-bit retention registers, such as a representative retention register 204. Although eight retention registers 204, 206, 208, 210, 212, 214, 216, and 218 are shown in FIG. 2, the retention register tray 200 may include more than eight retention registers or fewer than eight retention registers. The retention register tray 200 may be configured to store eight bits of data. The retention registers may be configured to enter or exit a standby mode based on an inverted retention signal (nret) 120. As described with respect to FIG. 6, the retention registers 204-218 of the retention register tray 200 may be configured such that non-volatile regions of the retention registers 204-218 may be fabricated in a single n-type well (n-well).

The retention register 204 may be configured to receive as inputs the inverted retention signal 120, the internal clock signal (clk_net) 122 and the inverted internal clock signal (nclk_net) 124 of FIG. 1, a shift data signal (sin) 220, a data input signal (d0) 230, a shift signal (shift) 250, an inverted shift signal (nshift) 252, and a reset signal (rst) 254. The retention register 204 may be configured to output a data out signal (q0) 240 or a shift data out signal (soutb0) 221. The internal clock signal 122 and the inverted internal clock signal 124 may be provided by a clock gating circuit, such as the clock gating circuit 100 of FIG. 1. The clock gating circuit 100 may be integrated with the retention register tray 200 or may be separate from the retention register tray 200. The inverted retention signal 120, the shift data signal 220, the data input signal 230, the shift signal 250, the inverted shift signal 252, and the reset signal 254 may be provided by one or more circuits external to the clock gating circuit 100 and the retention register tray 200.

Each retention register 204-218 of the retention register tray 200 may be configured to accept a data input signal 230-237 and a shift data signal 220-227 as inputs and to output a data out signal 240-247 and a shift data out signal 221-228. The retention registers 204-218 may be configured to receive a shift data out signal 220-227 from another retention register as the shift data signal 220-227. Thus, the retention registers 204-218 may be coupled together. The shift data out signal of a last retention register of the coupled retention registers (e.g., the shift data out signal 228 of the retention register 218) may be used to generate a retention tray output (nsout) 258. For example, the retention tray output 258 may be generated by inputting the shift data out signal of the retention register 218 and the shift signal 250 into a NAND gate 256. Relationships between the input signals and the output signals of the retention registers 204-218 are further described with reference to FIG. 3. Although FIG. 2 shows a NAND gate 256, other logic gates or switching arrangements may be used to generate the retention tray output 258.

Figure 3:
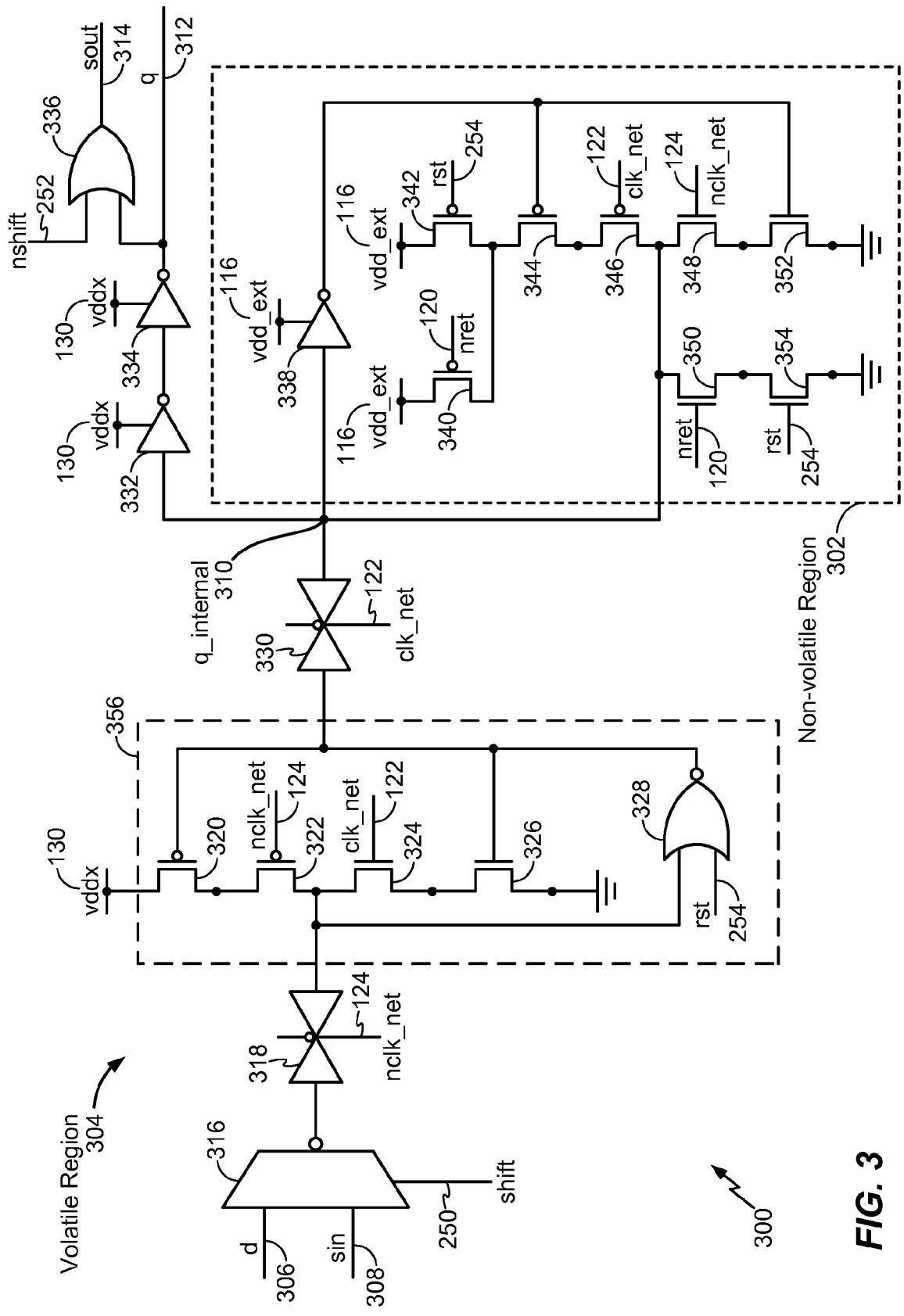
FIG. 3 is a diagram of a particular embodiment of a one-bit retention register.

Referring to FIG. 3, a particular illustrative embodiment of a one-bit retention register 300 is shown. The retention register 300 may correspond to one of the retention registers 204-218 of the retention register tray 200 of FIG. 2. The retention register 300 may include a non-volatile region 302 (e.g., a part of the retention register 300 that is powered on during the standby mode) and a volatile region 304 (e.g., a part of the retention register 300 that is powered off during the standby mode). Components located within the non-volatile region 302 may be powered by the external voltage source (vdd_ext) 116. Components located within the volatile region 304 may be powered by the internal voltage source (vddx) 130. Components located within the volatile region 304 may be configured to enter a floating state during the standby mode.

The retention register 300 may be configured to receive as inputs the inverted retention signal (nret) 120, the internal clock signal (clk_net) 122, the inverted internal clock signal (nclk_net) 124, a shift data signal (sin) 308, a data input signal (d) 306, the shift signal (shift) 250, the inverted shift signal (nshift) 252, and the reset signal (rst) 254. The retention register 300 may be configured to output a data out signal (q) 312 and a shift data out signal (sout) 314. The internal clock signal 122 and the inverted internal clock signal 124 may be provided by a clock gating circuit, such as the clock gating circuit 100 of FIG. 1.

The retention register 300 may be configured to select the data input signal 306 or the shift data signal 308 using the shift signal 250 at a multiplexer 316. The multiplexer 316 may be configured to output an inverted selected data signal (e.g., the inverse of the data input signal 306 or the inverse of the shift data signal 308) to a first transmission gate 318. The data input signal 306 may correspond to one of the data input signals 230-237 of FIG. 2. The shift data signal 308 may correspond to one of the shift data signals 220-227 of FIG. 2. The multiplexer 316 may be powered by the internal voltage source 130. The first transmission gate 318 may be configured to provide the inverted selected data signal to a volatile retention stage 356 responsive to the inverted internal clock signal 124.

The volatile retention stage 356 may receive the internal clock signal 122, the inverted internal clock signal 124, and the reset signal 254 as inputs. The inverted selected data signal and the reset signal 254 may be used to generate an output of the volatile retention stage 356 that is provided to a second transmission gate 330. For example, the output of the volatile retention stage 356 may be generated by inputting the inverse of the selected data signal and the reset signal 254 into a NOR gate 328. The NOR gate 328 may be configured to invert the inverted selected data signal and to provide the selected data signal to the second transmission gate 330 when the reset signal 254 is low (i.e., in a state associated with a logical low value). The NOR gate 328 may also cause the output of the volatile retention stage 356 to be low when the reset signal 254 is high (i.e., in a state associated with a logical high value). The output of the NOR gate 328 may be coupled to an input of a first PMOS transistor 320 and an input of a second NMOS transistor 326. The NOR gate 328 may be powered by the internal voltage source 130. Although FIG. 3 shows the NOR gate 328, other logic gates or switching arrangements may be used to generate the output of the volatile retention stage 356. The volatile retention stage 356 may be powered by the internal voltage source 130.

The volatile retention stage 356 includes a first p-channel metal-oxide-semiconductor (PMOS) transistor stack coupled to a first n-channel metal-oxide-semiconductor (NMOS) transistor stack. The first PMOS transistor stack may include the first PMOS transistor 320 and a second PMOS transistor 322 coupled in series. The first NMOS transistor stack may include a first NMOS transistor 324 coupled in series with the second PMOS transistor 322 and the second NMOS transistor 326 coupled in series with the first NMOS transistor 324. The first PMOS transistor stack and the first NMOS transistor stack may be configured to invert the output of the NOR gate 328 responsive to the inverted internal clock signal 124 and the internal clock signal 122. The volatile retention stage 356 may be configured to preserve the selected data signal and to transmit the selected data signal to the second transmission gate 330 when the reset signal 254 is disabled and the internal clock signal 122 is high. The first PMOS transistor stack and the first NMOS transistor stack may reduce leakage current associated with the volatile retention stage 356 due to self-reverse biasing effects during the standby mode.

The second transmission gate 330 may be configured to transmit the output of the volatile retention stage 356 to an internal data node (q_internal) 310 responsive to the internal clock signal 122. The internal data node 310 may be coupled to a chain of output inverters and to the non-volatile region 302. The chain of output inverters may include a first output inverter 332 and a second output inverter 334 coupled in series. The chain of output inverters may be powered by the internal voltage source 130. Although two inverters are shown in the chain of output inverters in FIG. 3, the chain of output inverters may include more than two inverters. The chain of output inverters may be configured to output a delayed internal node signal as the data out signal 312. The data out signal 312 may correspond to one of the data out signals 240-247 of FIG. 2.

The chain of output inverters may be further configured to provide the delayed internal data node signal to a logic gate. For example, the chain of output inverters may be configured to provide a delayed internal data node signal to an OR gate 336. The OR gate 336 may be configured to output a high signal as the shift data out signal 314 when the inverted shift signal 252 is enabled. The OR gate 336 may be further configured to output the delayed internal data node signal as the shift data out signal 314 when the inverted shift signal 252 is not enabled. The shift data out signal 312 may correspond to a shift data out signal 221-228 of FIG. 2. The OR gate 336 may be powered by the internal voltage source 130. Although FIG. 3 shows an OR gate, other logic gates or switching arrangements may be used to generate the shift data out signal 314.

The non-volatile region 302 may be configured to preserve a data signal (e.g., a state of the internal data node 310) when the retention register 300 is in a standby mode. The non-volatile region 302 may receive the inverted retention signal 120, the reset signal 254, the internal clock signal 122, and the inverted internal clock signal 124 as inputs. The non-volatile region 302 may be powered by the external voltage source 116. The non-volatile region 302 may include a non-volatile inverter 338 configured to supply an input to a second PMOS transistor stack. The non-volatile inverter 338 may be further configured to supply an input to a second NMOS transistor stack.

The second PMOS transistor stack may be coupled to the second NMOS transistor stack. The second PMOS transistor stack may include a third PMOS transistor 340, a fourth PMOS transistor 342, a fifth PMOS transistor 344, and a sixth PMOS transistor 346. Drains of the third PMOS transistor 340 and the fourth PMOS transistor 342 may be coupled to a source of the fifth PMOS transistor 344. The fifth PMOS transistor may be coupled in series with the sixth PMOS transistor 346. The second NMOS transistor stack may include a third NMOS transistor 348 coupled in series with the sixth PMOS transistor 346 and may include a fourth NMOS transistor 352 coupled in series with the third NMOS transistor 348. The third NMOS transistor 348 and the sixth PMOS transistor 346 may be further coupled to the internal data node 310. The non-volatile inverter 338, the second PMOS transistor stack, and the second NMOS transistor stack may be configured to preserve a value at the internal data node 310 when the retention register 300 is not in a reset mode. The second PMOS transistor stack and the second NMOS transistor stack may reduce leakage current associated with the non-volatile region 302 due to self-reverse biasing effects during the reset mode.

The second PMOS transistor stack and the second NMOS transistor stack may further be coupled to a third NMOS transistor stack. The third NMOS transistor stack may include a fifth NMOS transistor 350 coupled in series with a sixth NMOS transistor 354. The fifth NMOS transistor 350 may be further coupled to the third NMOS transistor 348, to the sixth PMOS transistor 346, and to the internal data node 310. The third NMOS transistor stack may be configured to set a value at the internal data node 310 to low when the retention register 300 is in a reset mode and not in the standby mode. When the inverted retention signal 120 or the reset signal 254 is low, a state of the internal data node 310 may be retained when the internal clock signal 122 is high, and the non-volatile region 302 may output a floating (hi-Z) signal when the internal clock signal 122 is low. When the inverted retention signal 120 and the reset signal 254 are high, the value at the internal data node 310 may be pulled down to low.

During operation, the multiplexer 316 may be configured to output the inverted selected data signal to the first transmission gate 318. The first transmission gate 318 may be configured to provide the inverted selected data signal to the volatile retention stage 356 responsive to the inverted internal clock signal 124. When the reset signal 254 is low, the volatile retention stage 356 may be configured to retain the inverted selected data signal and to provide the selected data signal to the second transmission gate 330. When the reset signal 254 is high, the volatile retention stage 356 may be configured to retain a low value and provide the low value to the second transmission gate 330. The second transmission gate 330 may be configured to provide the output of the volatile retention stage (e.g., the selected data signal or the low value) to the internal data node 310 responsive to the internal clock signal 122. The internal data node 310 may be connected to the chain of output inverters and to the non-volatile region 302. The non-volatile region 302 may be configured to retain the state of the internal data node 310 when the retention register 300 is in a standby mode and the volatile region 304 is unpowered. The non-volatile region 302 may be further configured to set the value of the internal data node 310 to low when the reset signal 254 is high. The chain of output inverters may be configured to output the delayed internal node signal as the data out signal 312. The chain of output inverters may be further configured to provide the delayed internal data node signal to a logic gate to selectively output the shift data out signal 314.

Accordingly, a leakage current associated with the volatile retention stage 356 of the retention register 300 during a standby mode and a leakage current associated with the non-volatile region 302 of the retention register 300 during a reset mode may be reduced due to self-reverse biasing effects. Thus, an available operation time of an electronic device that incorporates the retention register 300 may be increased when the electronic device runs on stored power.

Figure 4:
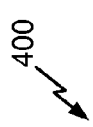
FIG. 4 is a truth table illustrating a particular embodiment of functions of the retention register of FIG. 3.

FIG. 4 is a truth table 400 illustrating the functioning of a retention register, such as the retention register 300 of FIG. 3, according to a particular embodiment. FIG. 4 illustrates values of the outputs q and sout based on values of data inputs ret, d, rst, sin, and shift. In a functional mode, the value of q is equal to the value of d and the value of sout is equal to 1 (i.e., in a state associated with a logical high value). In a reset mode, the value of rst is equal 1, the value of q is equal to 0 (i.e., in a state associated with a logical low value) and the value of sout is equal to 1. In a scan mode, the value of shift is equal to 1, and the values of q and sout are equal to the value of sin. In a standby mode, the value of ret is equal to 1, the internal voltage source (vddx) is off, a previous value of q is stored in a non-volatile region, such as the non-volatile region 302 of FIG. 3, and the values of q and sout are not used. Components located within the volatile region 304 of FIG. 3 may be configured to enter a floating state (i.e. a value driven by a collapsed domain), represented by a X in FIG. 4, when power is reduced to the volatile region 304 in the standby mode. FIG. 4 also illustrates a number of corner cases where the internal voltage source (vddx) is on and the value of ret is high.

Figure 5:
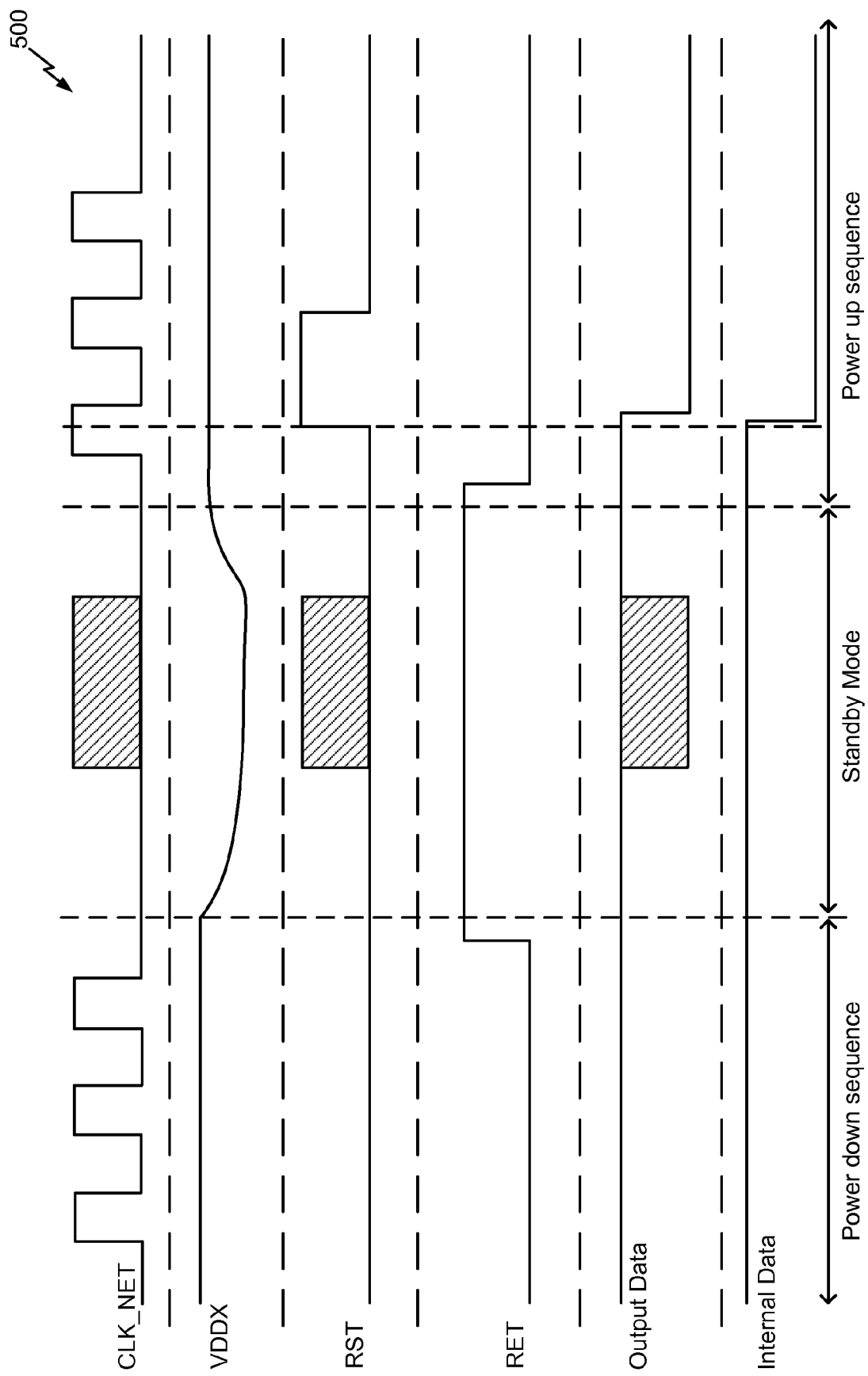
FIG. 5 is a timing diagram illustrating a particular embodiment of a standby mode of the retention register of FIG. 3.

FIG. 5 illustrates a sample operation of a retention register, such as the retention register 300 of FIG. 3. FIG. 5 illustrates a graph 500 of an internal clock signal (CLK_NET), an internal voltage (VDDX), a reset signal (RST), a retention signal (RET), a data output value (Output Data), and an internal data value (Internal Data) during a power down sequence, a standby mode, and a power up sequence of a retention register such as retention register 300. The internal clock signal may correspond to the internal clock signal 122 of FIG. 3. The internal voltage may correspond to a voltage at the internal voltage source 130 of FIG. 3. The reset signal may correspond to the reset signal 254 of FIG. 3. The retention signal may correspond to an inverse of the inverted retention signal 120 of FIG. 3. The data output value may correspond to the shift data out signal 314 or the data out signal 312 of FIG. 3. The internal data value may correspond to a value at the internal data node 310 of FIG. 3.

As illustrated by the graph 500, the retention signal may be set to high before the retention register enters a standby mode. Subsequently, the internal voltage may be decreased. Values at the internal clock signal, the reset signal, and the data output value are not used during the standby mode. However, the internal data value may be preserved during the standby mode.

When the retention register prepares to exit the standby mode, the internal voltage may be increased. The retention signal may be set to low after the internal voltage has stabilized. The data output value may reflect the internal data value. When the retention register receives a reset signal, the retention register may set the internal data value and the data output value to low.

Figure 6:
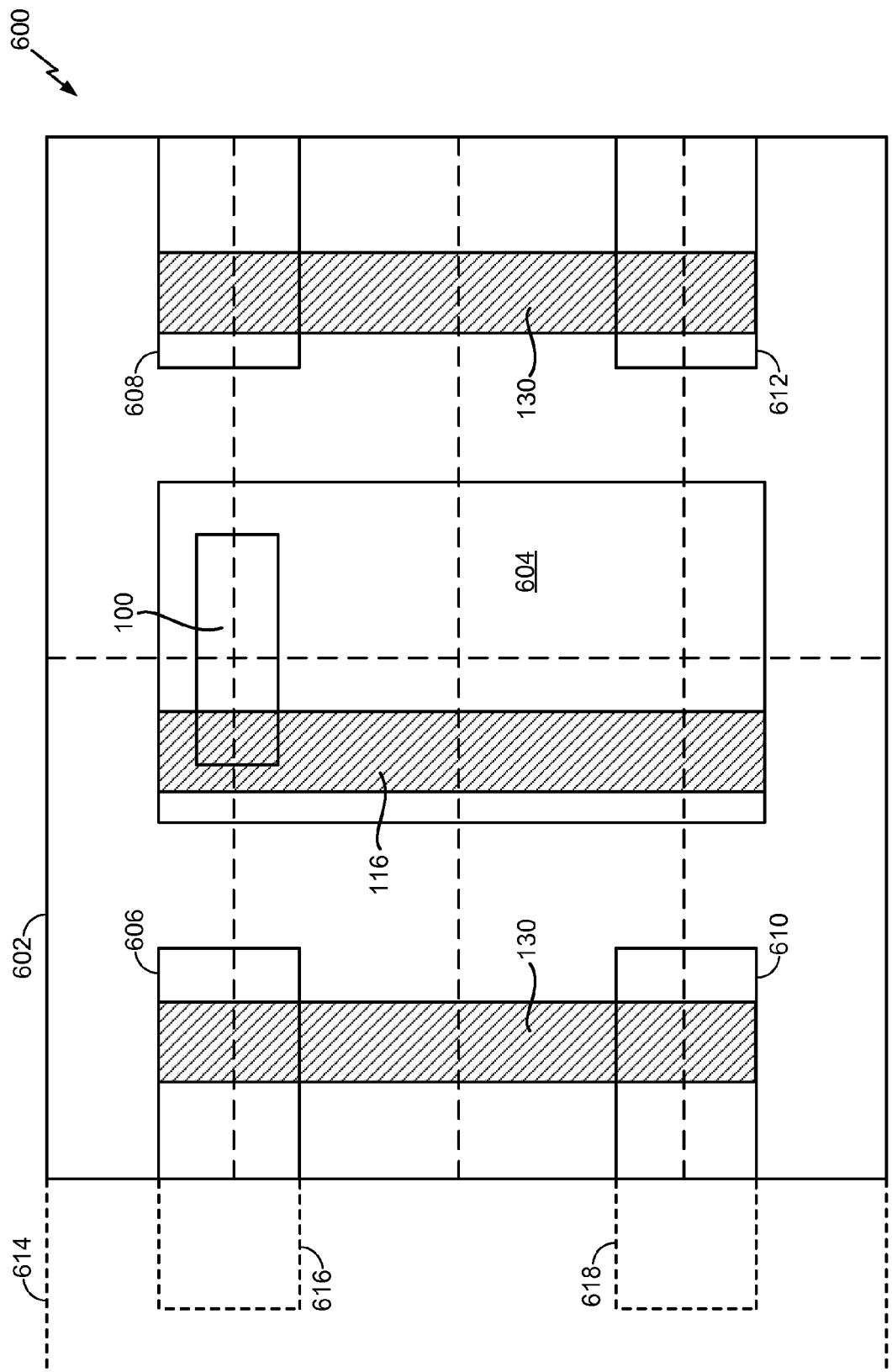
FIG. 6 is a layout diagram of a particular embodiment of a retention register tray.

Referring to FIG. 6, a layout diagram of a particular embodiment of a retention register tray 600 is shown. The retention register tray 600 may correspond to the retention register tray 200 of FIG. 2. The retention register tray 600 may be integrated into a first semiconductor device region 602. The retention register tray 600 may include one or more one-bit retention registers. Eight retention registers are shown in the first semiconductor device region 602 of FIG. 6, corresponding to areas separated by dashed lines. In other embodiments, the retention register tray 600 may include more than eight retention registers or fewer than eight retention registers. Each retention register of the retention register tray 600 may correspond to the retention register 300 of FIG. 3.

During fabrication of the retention register tray 600 in the first semiconductor device region 602, the non-volatile regions of each retention register may be grouped together in a first n-type well (n-well) 604. The first n-well 604 may be powered by the external voltage source 116. The non-volatile region of each retention register may correspond to the non-volatile region 302 of FIG. 3. Furthermore, the first n-well 604 may include the clock gating circuit 100 of FIG. 1. Although one n-well powered by the external voltage source 116 (e.g., the first n-well 604) is shown in FIG. 6 in other embodiments, the retention register tray 600 may include more than one n-well powered by the external voltage source 116. Manufacturing complexity may be reduced by merging the non-volatile regions of more than one retention register into a single n-well during fabrication. Also, routing of an internal clock signal (e.g., the internal clock signal 122 of FIG. 1) and an inverted internal clock signal (e.g., the inverted internal clock signal 124 of FIG. 1) may be more compact (i.e., using less power and having a smaller delay) in a single n-well as compared to multiple n-wells.

Volatile regions of each retention register may be placed in n-wells that are separate from the first n-well (e.g., a second n-well 606, a third n-well 608, a fourth n-well 610, and a fifth n-well 612). The n-wells that are separate from the first n-well 604 may be powered by the internal voltage source 130. The volatile region of each retention register may correspond to the volatile region 304 of FIG. 3. Although the second n-well 606, the third n-well 608, the fourth n-well 610, and the fifth n-well 612 are each shared by two retention registers in FIG. 6, in other embodiments, the n-wells 606-612 may each include the volatile regions of more than two retention registers or fewer than two retention registers. Manufacturing complexity may be reduced by merging the volatile regions of more than one retention register into a single n-well during fabrication.

According to manufacturing design restrictions, the first n-well 604 may be placed a particular distance away from another n-well (e.g., the second n-well 606, the third n-well 608, the fourth n-well 610, and the fifth n-well 612). Furthermore, it may be desirable to place a second semiconductor device region 614 adjacent to the first semiconductor device region 602. The second semiconductor device region 614 may be part of a semiconductor die that contains the first semiconductor device region 602, or the second semiconductor device region 614 may be part of a different semiconductor die than the semiconductor die that contains the first semiconductor device region 602. The second semiconductor device 614 may include one or more n-wells (e.g., a sixth n-well 616 and a seventh n-well 618). One particular advantage provided by at least one of the disclosed embodiments is that design complexity may be reduced by placing each non-volatile region (e.g., the first n-well 604) a distance away from the edges of the semiconductor device such that a second semiconductor device region containing an n-well may be placed adjacent to a first semiconductor device region containing a non-volatile region without violating design restrictions of the non-volatile region.

Accordingly, manufacturing complexity and design complexity associated with a retention register tray 600 may be reduced. Thus, semiconductor dies that incorporate the retention register tray 600 may be more easily fabricated.

Figure 7:
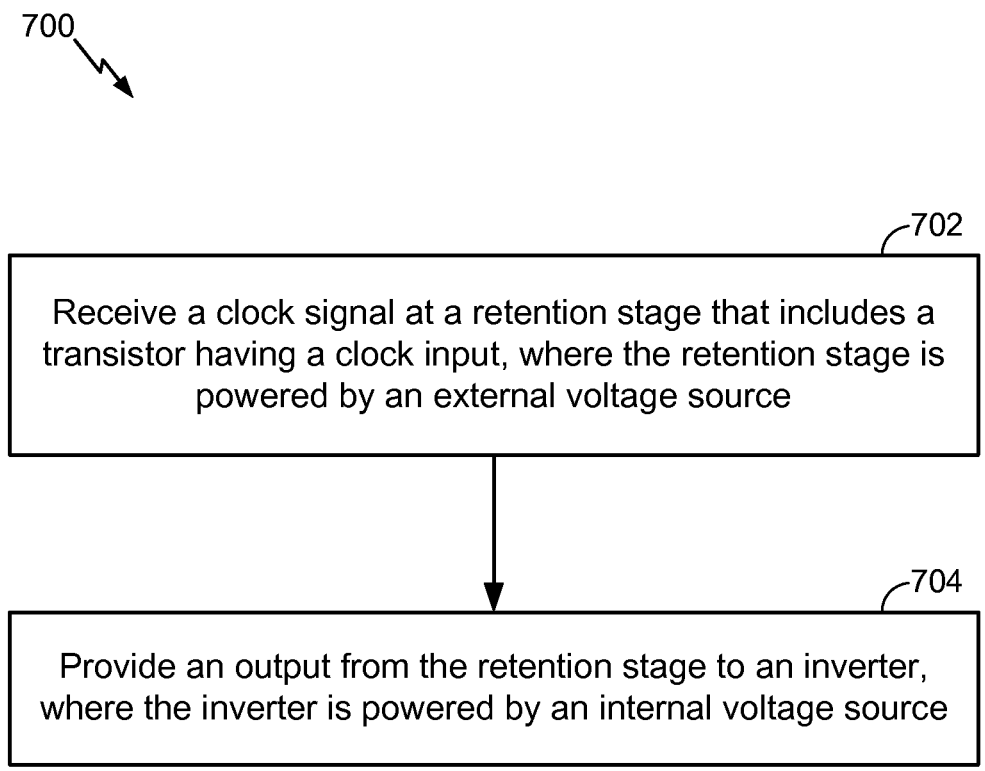
FIG. 7 is a flowchart illustrating a particular embodiment of a method of operating a clock gating circuit.

FIG. 7 is a flowchart illustrating a particular embodiment of a method 700 of operating a clock gating circuit. In one embodiment, the clock gating circuit corresponds to the clock gating circuit 100 of FIG. 1. The method 700 includes, at 702, receiving a clock signal at a retention stage that includes a transistor having a clock input. The retention stage may be powered by an external voltage source. The retention stage 102 of the clock gating circuit 100 may receive the external clock signal 106 at a transistor that has a clock input, such as the second PMOS transistor 110 or the first NMOS transistor 112. The retention stage 102 may be powered by the external voltage source 116. The method 700 further includes, at 704, providing an output from the retention stage to an inverter, where the inverter is powered by an internal voltage source. For example, the retention stage 102 may provide an output to the inverter 104 via the data line 134. The inverter 104 may be powered by the internal voltage source 130.

An output of the inverter of the method 700 may be provided to a first retention register or to a first retention register and a second retention register, where the first retention register and the second retention register form a retention register tray, and where the first retention register is coupled to the second retention register. For example, an output of the inverter 104 of FIG. 1 may be provided to the retention register 204 and the retention register 206 of FIG. 2, where the retention register 204 and the retention register 206 form the retention register tray 200, and where the retention register 204 is coupled to the retention register 206 along a data line used to transmit a data out signal (soutb0) 221. The retention stage may receive a retention signal and an inverted retention signal. For example, the retention stage 102 may receive the retention signal 118 and the inverted retention signal 120. A first retention register may be triggered to enter into a standby mode or to exit the standby mode based on the inverted retention signal.

Thus, the method 700 enables a clock gating circuit to issue a clock signal and an inverted clock signal even though the retention stage and the inverted retention stage are powered by different voltage sources. Accordingly, a leakage current associated with the clock gating circuit when the clock gating circuit is in a standby mode may be reduced. Therefore, an available operation time of an electronic device that incorporates the clock gating circuit may be increased when the electronic device runs on stored power.

Figure 8:
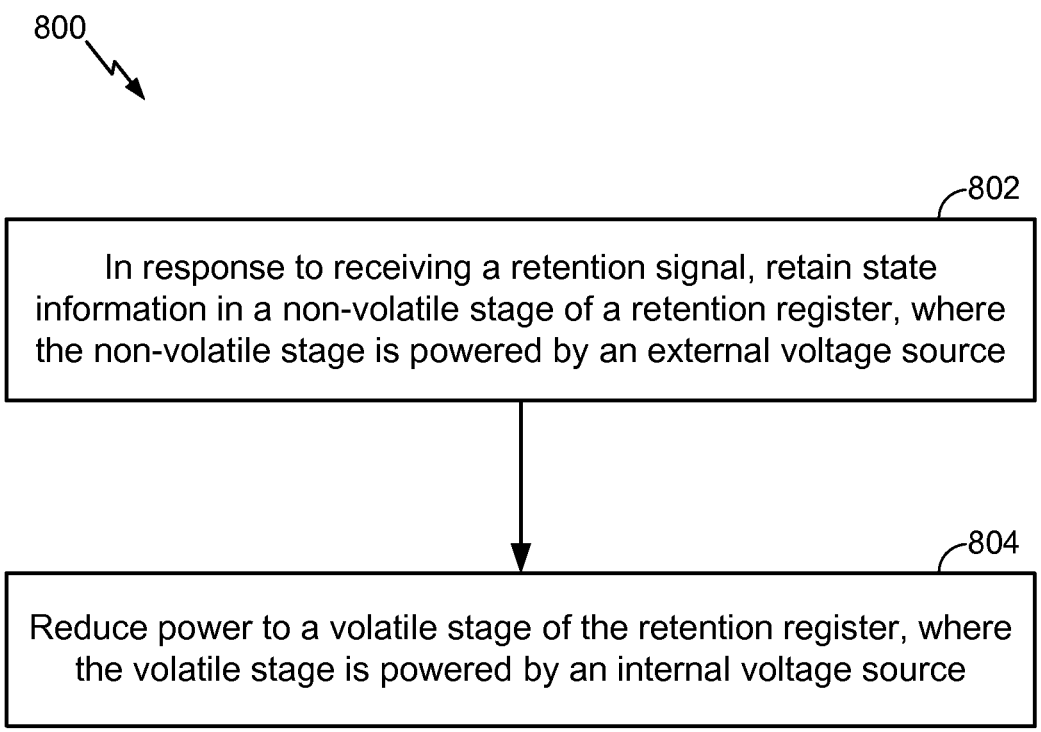
FIG. 8 is a flowchart illustrating a particular embodiment of an operation of a retention register.

FIG. 8 is a flowchart illustrating a particular embodiment of a method 800 of operating a retention register. In one embodiment, the retention register corresponds to the retention register 300 of FIG. 3. The method 800 includes, at 802, in response to receiving a retention signal, retaining state information in a non-volatile stage of a retention register, where the non-volatile stage is powered by an external voltage source. For example, the retention register 300 may receive the inverted retention signal 120. The inverted retention signal 120 may be provided by one or more circuits external to the clock gating circuit 100 and the retention register tray 200 (e.g., from a processor based on a determination to enter a standby mode). In response to the inverted retention signal 120, the non-volatile region 302 of the retention register 300 may retain state information. The state information may include at least an internal data state (e.g., a value at the internal data node 310). The non-volatile region 302 may be powered by the external voltage source 116.

The method 800 further includes, at 804, reducing power to a volatile stage of the retention register, where the volatile stage is powered by an internal voltage source. For example, power may be reduced to the volatile region 304 of the retention register 300. The volatile region 304 may be powered by the internal voltage source 130.

The method 800 may enable the retention register to retain data when power to a volatile region of the retention register is reduced.

The methods of FIGS. 7 and 8 may be implemented by various devices, such as a field-programmable gate array (FPGA) device, an application-specific integrated circuit (ASIC), a processing unit (e.g., a central processing unit (CPU)), a digital signal processor (DSP), a controller, another hardware device, a firmware device, or any combination thereof. As an example, the methods of FIGS. 7 and 8 can be performed by one or more processors that execute instructions, as further described with reference to FIG. 9. To illustrate, the method of FIG. 7 can be initiated by a processor configured to issue a retention signal to a retention stage of a clock gating circuit. The retention stage may be powered by an external voltage source and may be configured to receive a clock signal and to provide an output to an inverter. The inverter may be powered by an internal voltage source.

Figure 9:
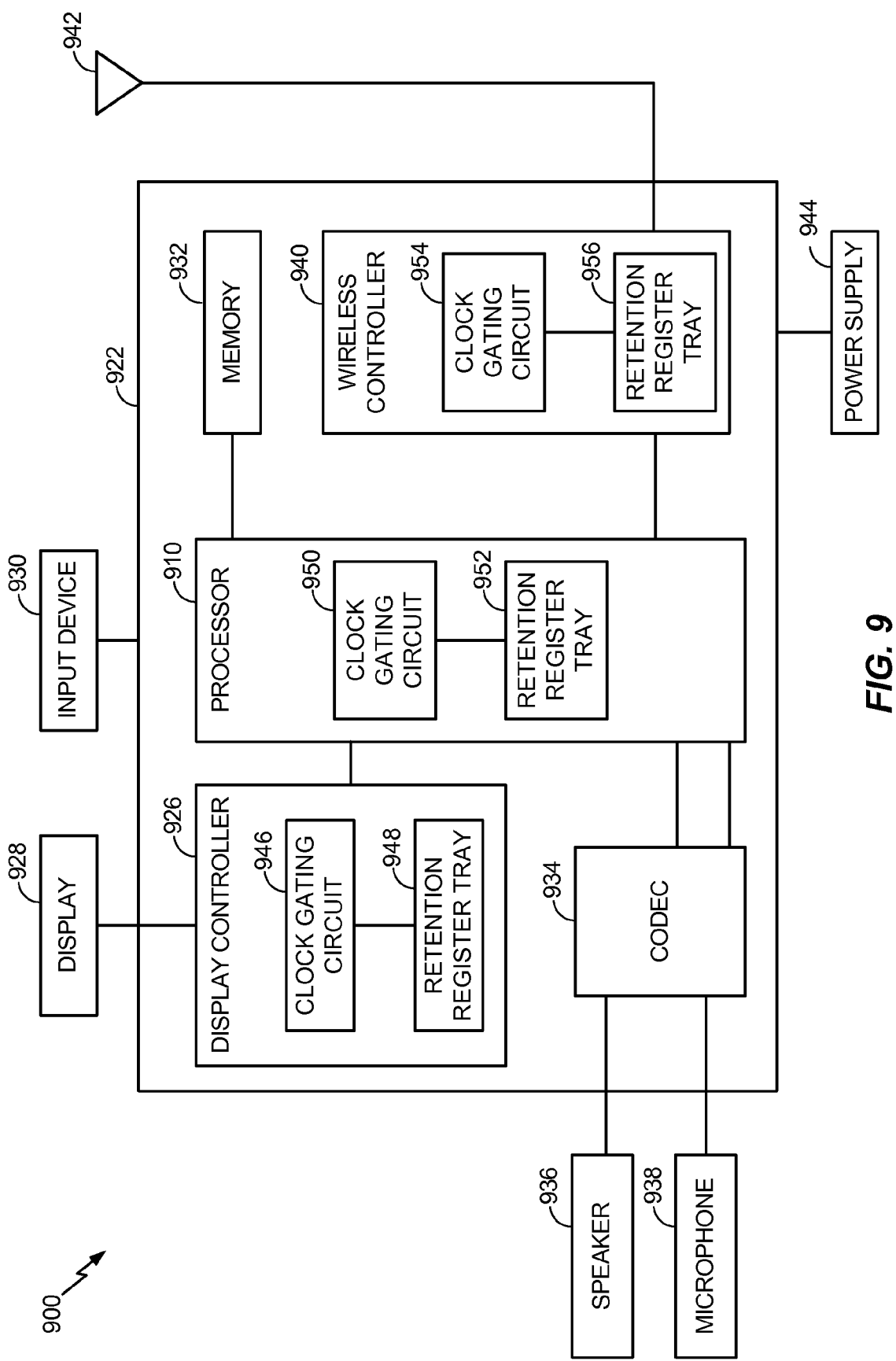
FIG. 9 is a block diagram of a communication device including a clock gating circuit and a retention register tray.

Referring to FIG. 9, a block diagram of a particular illustrative embodiment of a communication device incorporating a retention register tray and a clock gating circuit is depicted and generally designated 900. The communication device 900, or components thereof, may include, implement, or be included within a device such as: a mobile station, an access point, a set top box, an entertainment unit, a navigation device, a communications device, a personal digital assistant (PDA), a fixed location data unit, a mobile location data unit, a mobile phone, a cellular phone, a computer, a portable computer, a desktop computer, a tablet, a monitor, a computer monitor, a television, a tuner, a radio, a satellite radio, a music player, a digital music player, a portable music player, a video player, a digital video player, a digital video disc (DVD) player, or a portable digital video player, where each may be configured to execute one or more of the methods of FIGS. 7 and 8. In one embodiment, the communication device 900 includes at least one clock gating circuit 100 of FIG. 1 and at least one retention register tray 200 of FIG. 2.

The communication device 900 includes a processor 910, such as a digital signal processor (DSP), coupled to a memory 932. In a particular embodiment, the processor 910 includes a clock gating circuit 950 (e.g., the clock gating circuit 100 of FIG. 1) connected to a retention register tray 952 (e.g., the retention register tray 200 of FIG. 2). As an example, the memory 932 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), registers, hard disk, a removable disk, or a compact disc read-only memory (CD-ROM). The memory device may include instructions that, when executed by a processor (e.g., the processor 910, a display controller 926, or a wireless controller 940), may cause the processor to issue a retention signal that is provided to a retention stage (e.g., the retention stage 102 of FIG. 1). The retention stage may be powered by an external voltage source (e.g., the external voltage source 116 of FIG. 1), may be configured to receive a clock signal (e.g., the external clock signal 106 of FIG. 1), and may be configured to provide an output to an inverter (e.g., the inverter 104 of FIG. 1). The inverter may be powered by an internal voltage source (e.g., the internal voltage source 130 of FIG. 1).

The communication device 900 may include the display controller 926 that is coupled to the processor 910 and to a display 928. In a particular embodiment, the display controller 926 includes a clock gating circuit 946 (e.g., the clock gating circuit 100 of FIG. 1) connected to a retention register tray 948 (e.g., the retention register tray 200 of FIG. 2). A coder/decoder (CODEC) 934 can also be coupled to the processor 910. A speaker 936 and a microphone 938 can be coupled to the CODEC 934. The wireless controller 940 (e.g., a receiver, a transmitter, or a transceiver) can be coupled to the processor 910 and to an antenna 942. In a particular embodiment, the wireless controller 940 includes a clock gating circuit 954 (e.g., the clock gating circuit 100 of FIG. 1) connected to a retention register tray 956 (e.g., the retention register tray 200 of FIG. 2).

In conjunction with the described embodiments, an apparatus includes means for switching data. The means for switching data can include a gate having a clock input. The means for switching data may be powered by an external voltage source. In one embodiment, the processor 910, the display controller 926, or the wireless controller 940 includes a clock gating circuit corresponding to the clock gating circuit 100 of FIG. 1, and the means for switching data corresponds to the retention stage 102 of the clock gating circuit 100. The apparatus may further include means for inverting an output of the means for switching data. The means for inverting may be powered by an internal voltage source. For example, the means for inverting may correspond to the inverter 104 of the clock gating circuit 100 of FIG. 1.

In conjunction with the described embodiments, an apparatus includes means for retaining a first bit. In one embodiment, the processor 910, the display controller 926, or the wireless controller 940 includes a retention register tray corresponding to the retention register tray 200 of FIG. 2, and the means for retaining a first bit corresponds to the retention register 204 of the retention register tray 200. The apparatus may further include means for retaining a second bit. For example, the means for retaining a second bit may correspond to the retention register 206 of the retention register tray 200. The means for retaining a first bit and the means for retaining a second bit may form a means for retaining data. For example, the means for retaining data may correspond to the retention register tray 200.

In conjunction with the described embodiments, an apparatus includes means for supplying a clock signal to the means for retaining a first bit and the means for retaining a second bit. In one embodiment, the processor 910, the display controller 926, or the wireless controller 940 includes a clock gating circuit corresponding to the clock gating circuit 100 of FIG. 1, and the means for supplying a clock signal corresponds to the clock gating circuit 100 of FIG. 1. The means for supplying a clock signal may be external to the means for retaining data. For example, the clock gating circuit 100 may be external to the retention register tray 200 of FIG. 2. The means for supplying a clock signal includes a first stage powered by an external voltage source and a second stage powered by an internal voltage source. For example, the clock gating circuit 100 includes a retention stage 102 powered by an external voltage source 116 and an inverter 104 powered by an internal voltage source 130.

In a particular embodiment, the processor 910, the display controller 926, the memory 932, the CODEC 934, and the wireless controller 940 are included at a system-in-package or system-on-chip device 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the antenna 942, and the power supply 944 are external to the system-on-chip device 922. However, each of the display 928, the input device 930, the speaker 936, the microphone 938, the antenna 942, and the power supply 944 can be coupled to a component of the system-on-chip device 922, such as an interface or a controller.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a first retention register that includes a first non-volatile region and a first volatile region; and
   a second retention register that includes a second non-volatile region and a second volatile region, wherein the first retention register is coupled to the second retention register, and the second volatile region comprises:
      a multiplexer configured to select a shift data signal from the first retention register or an input data signal according to a shift signal; and
      a volatile retention stage configured to latch the selected one of the shift data signal and the input data signal according to a clock signal;
   wherein the first non-volatile region and the second non-volatile region are located in a first n-type well (n-well) that is connected to an external voltage source, and wherein the first volatile region and the second volatile region are located in a second n-well that is connected to an internal voltage source.

2. The circuit of claim 1, wherein the first retention register and the second retention register form a retention register tray.

3. A circuit comprising:
   a first retention register that includes a first non-volatile region and a first volatile region;
   a second retention register that includes a second non-volatile region and a second volatile region, wherein the first retention register and the second retention register form a retention register tray; and
   a clock gating circuit configured to supply a clock signal to the first retention register and to supply the clock signal to the second retention register, wherein the first non-volatile region, the second non-volatile region and the clock gating circuit are located in a first n-type well (n-well) that is connected to an external voltage source, and wherein the first volatile region and the second volatile region are located in a second n-well that is connected to an internal voltage source.

4. A method comprising:
   in response to receiving a retention signal:
      retaining state information in a non-volatile stage of a retention register; and
      reducing power to a volatile stage of the retention register, wherein the non-volatile stage is powered by an external voltage source, the volatile stage is powered by an internal voltage source, and the non-volatile stage comprises a stack of transistors; and in response to receiving a reset signal, reverse biasing one or more transistors in the stack of transistors to reduce leakage current.

5. The method of claim 4, wherein the state information includes at least an internal data state.

6. The method of claim 4, wherein components located within the volatile stage enter a floating state when power is reduced to the volatile stage.

7. An apparatus comprising:
  means for retaining state information in a non-volatile stage of a retention register in response to receiving a retention signal;
  means for reducing power to a volatile stage of the retention register in response to receiving the retention signal, wherein the non-volatile stage is powered by an external voltage source, the volatile stage is powered by an internal voltage source, and the non-volatile stage comprises a stack of transistors; and
  means for reverse biasing one or more transistors in the stack of transistors to reduce leakage current in response to receiving a reset signal.

8. The apparatus of claim 7, wherein the state information includes at least an internal data state.

9. The apparatus of claim 7, wherein components located within the volatile stage enter a floating state when power is reduced to the volatile stage.

\* \* \* \* \*